(12) United States Patent
Khesbak

(10) Patent No.: US 9,257,940 B2
(45) Date of Patent: Feb. 9, 2016

(54) APPARATUS AND METHODS FOR CAPACITIVE LOAD REDUCTION

(71) Applicant: SKYWORKS SOLUTIONS, INC., Woburn, MA (US)

(72) Inventor: Sabah Khesbak, Irvine, CA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 70 days.

(21) Appl. No.: 14/067,828

(22) Filed: Oct. 30, 2013

(65) Prior Publication Data

US 2014/0084998 A1 Mar. 27, 2014

Related U.S. Application Data

(63) Continuation of application No. 13/323,503, filed on Dec. 12, 2011, now Pat. No. 8,598,950.

(60) Provisional application No. 61/422,769, filed on Dec. 14, 2010.

(51) Int. Cl.
*H03F 1/02* (2006.01)
*H03F 1/56* (2006.01)
(Continued)

(52) U.S. Cl.
CPC ............ *H03F 1/0222* (2013.01); *H03F 1/0227* (2013.01); *H03F 1/0277* (2013.01);
(Continued)

(58) Field of Classification Search
CPC ....... H05B 33/0815; G06F 1/26; G06F 3/044; H03F 1/0227; H03F 2200/451; H03F 3/193; H03F 1/0205; H03F 3/16; H03F 3/2171; H03F 3/45179; H03F 3/45995

USPC .................... 330/51, 127, 297; 323/282, 314; 455/127.1

See application file for complete search history.

(56) References Cited

U.S. PATENT DOCUMENTS

| 5,264,752 A | 11/1993 | Savicki |
| 6,975,166 B2 | 12/2005 | Grillo et al. |

(Continued)

FOREIGN PATENT DOCUMENTS

| CN | 1672322 A | 9/2005 |
| GB | 2398648 | 8/2004 |

(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

(Continued)

*Primary Examiner* — Khanh V Nguyen
(74) *Attorney, Agent, or Firm* — Knobbe Martens Olson & Bear LLP

(57) ABSTRACT

Apparatus and methods for capacitive load reduction are disclosed. In one embodiment, a power amplifier system includes a plurality of power amplifiers and an envelope tracking module for generating a supply voltage for the power amplifiers. The power amplifier system further includes a switch and a decoupling capacitor operatively associated with a first power amplifier of the system. The switch is configured to electrically float an end of the decoupling capacitor when the first power amplifier is disabled so as to reduce capacitive loading of the envelope tracker and to operate as a dampening resistor when the power amplifier is enabled so as to improve the stability of the system.

20 Claims, 11 Drawing Sheets

(51) Int. Cl.
*H03F 3/19* (2006.01)
*H03F 3/24* (2006.01)
*H03F 3/68* (2006.01)
*H03F 3/72* (2006.01)

(52) U.S. Cl.
CPC . *H03F 1/56* (2013.01); *H03F 3/19* (2013.01); *H03F 3/245* (2013.01); *H03F 3/68* (2013.01); *H03F 3/72* (2013.01); *H03F 2200/102* (2013.01); *H03F 2200/222* (2013.01); *H03F 2200/318* (2013.01); *H03F 2200/387* (2013.01); *H03F 2200/411* (2013.01); *H03F 2200/429* (2013.01); *H03F 2200/432* (2013.01); *H03F 2200/504* (2013.01); *H03F 2200/516* (2013.01); *H03F 2203/7209* (2013.01); *H03F 2203/7221* (2013.01); *H03F 2203/7236* (2013.01)

(56) References Cited

U.S. PATENT DOCUMENTS

| | | | |
|---|---|---|---|
| 7,400,865 | B2 | 7/2008 | Jarvinen |
| 7,471,155 | B1* | 12/2008 | Levesque ............... 330/297 |
| 7,482,869 | B2 | 1/2009 | Wilson |
| 7,764,055 | B2* | 7/2010 | Rozenblit et al. ........... 323/282 |
| 8,598,950 | B2 | 12/2013 | Khesbak |
| 2002/0030543 | A1 | 3/2002 | French et al. |
| 2003/0155978 | A1 | 8/2003 | Pehlke |
| 2006/0178119 | A1 | 8/2006 | Jarvinen |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2009/0128236 | A1 | 5/2009 | Wilson |
| 2009/0289720 | A1 | 11/2009 | Takinami et al. |
| 2009/0302941 | A1 | 12/2009 | Wimpenny |
| 2011/0221533 | A1* | 9/2011 | Lesso ............... 330/297 |

FOREIGN PATENT DOCUMENTS

| | | |
|---|---|---|
| GB | 2409115 | 11/2006 |
| GB | 2426392 | 5/2007 |
| GB | 2411062 | 11/2007 |
| JP | 2008-148098 A | 6/2008 |
| JP | 2008-294812 | 12/2008 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.
Kaneta et al. "Architecture of Wideband High-Efficiency Envelope Tracking Power Amplifier for Base Station," IEICE Technical Report, Osaka, 2009 (6 pages).
Kang et al. "A Multimode/Multiband Power Amplifier With a Boosted Supply Modulator," IEEE Transactions on Microwave Theory and Techniques, vol. 58, No. 10, Oct. 2010, pp. 2598-2608.
Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.
Wu et al. "A Two-Phase Switching Hybrid Supply Modulator for Polar Transmitters with 9% Efficiency Improvement," IEEE International Solid-State Circuits Conference, Feb. 2010, pp. 196-198.
Yousefzadeh et al. "Three-Level Buck Converter for Envelope Tracking Applications," IEEE Transactions on Power Electronics, vol. 21, No. 2, Mar. 2006, pp. 549-552.
International Search Report in PCT/US2011/064720, dated Mar. 19, 2012.
Written Opinion of the International Searching Authority in PCT/US2011/064720, dated Mar. 19, 2012.

* cited by examiner

APPARATUS AND METHODS FOR CAPACITIVE LOAD REDUCTION

CROSS-REFERENCE TO RELATED APPLICATIONS

This application is a continuation of U.S. patent application Ser. No. 13/323,503, filed Dec. 12, 2011, entitled APPARATUS AND METHODS FOR CAPACITIVE LOAD REDUCTION, which claims the benefit of priority under 35 U.S.C. §119(e) of U.S. Provisional Patent Application No. 61/422,769, filed Dec. 14, 2010 entitled "APPARATUS AND METHOD FOR CAPACITIVE LOAD REDUCTION", which is herein incorporated by reference in its entirety.

BACKGROUND

1. Field

Embodiments of the invention relate to electronic systems, and in particular, to radio frequency (RF) electronics.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is changed in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

There is a need for improved power amplifiers. Furthermore, there is a need for power amplifier systems including an envelope tracker having a reduced capacitive load.

SUMMARY

In certain embodiments, the present disclosure relates to a mobile device including a plurality of power amplifiers, an envelope tracking module, a first switchable capacitor, and a first switch. The plurality of power amplifiers includes a first power amplifier configured to amplify a first radio frequency (RF) signal. The first power amplifier has an enabled state and a disabled state. The envelope tracking module is configured to generate a supply voltage for a first supply node used to electrically power the plurality of power amplifiers. The first switchable capacitor is operatively associated with the first power amplifier and has a first end and a second end, the first end electrically connected to the first supply node. The first switch is operatively associated with the first power amplifier and is configured to control a voltage of the second end of the first switchable capacitor. The first switch is configured to electrically float the second end of the first switchable capacitor when the first power amplifier is disabled so as to reduce a capacitive loading of the envelope tracking module.

In various embodiments, the first switch is configured to provide a low impedance path between the second end of the first switchable capacitor and a second supply node when the first power amplifier is enabled.

In a number of embodiments, the mobile device further includes a power amplifier control block configured to bias the first switch as a dampening resistor.

In some embodiments, the first switch includes a field-effect transistor (FET). In accordance with several embodiments, the power amplifier control block is configured to bias the FET so as to have a channel resistance in the range of about 0.5Ω to about 2Ω when the first power amplifier is enabled so as to provide stability to the first power amplifier. In some embodiments, the power amplifier control block includes a digital-to-analog converter configured to generate a control signal for biasing a gate of the FET.

In several embodiments, the mobile device further includes a second switchable capacitor and a second switch each operatively associated with a second power amplifier of the plurality of power amplifiers. The second switchable capacitor has a first end electrically connected to the first supply node and a second end. The second switch is configured to electrically float the second end of the second switchable capacitor when the second power amplifier is disabled.

In some embodiments, the mobile device further includes a die, and the first switch and the first power amplifier are formed on the die. In certain embodiments, the mobile device further includes a multi-chip module (MCM) including the first switchable capacitor and the die. According to several embodiments, the mobile device further includes a phone board, and the MCM and the envelope tracking module are mounted on the phone board.

In a number of embodiments, the envelope tracking module is configured to control the supply voltage based at least partly upon the envelope of the first RF signal.

In certain embodiments, the present disclosure relates to a power amplifier module including a first amplification die, a first power supply pin, a first switchable capacitor, and a first switch. The first amplification die includes a first power amplifier configured to amplify a first radio frequency (RF) signal, the first amplifier having an enabled state and a disabled state. The first power supply pin is electrically connected to a supply input of the first amplification die. The first switchable capacitor is operatively associated with the first amplification die, and has a first end and a second end. The first end is electrically connected to the first power supply pin. The first switch is disposed on the first amplification die and is configured to control a voltage of the second end of the first switchable capacitor. The first switch is configured to electrically float the second end of the first switchable capacitor when the first power amplifier is disabled so as to reduce a capacitance of the first power supply pin.

According to several embodiments, the first switch is configured to provide a low impedance path between the second end of the first switchable capacitor and a ground pin when the first power amplifier is enabled.

In some embodiments, the power amplifier module further includes a power amplifier bias control die configured to control an impedance of the first switch.

In a number of embodiments, the power amplifier bias control die is configured to bias the first switch as a dampening resistor when the first power amplifier is enabled.

In various embodiments, further including a second amplification die including a second power amplifier, the first power supply pin electrically connected to a supply input of the second amplification die.

In a number of embodiments, the first switchable capacitor is a surface mount component.

In some embodiments, the first switch is a field-effect transistor (FET).

In various embodiments, the first power amplifier includes a first stage and a second stage, the first stage configured to drive the second stage. In some embodiments, the second stage is electrically connected to the first power supply pin and the first stage is electrically connected to a second power supply pin. In a number of embodiments, the first and second stages are each electrically connected to the first power supply pin.

In certain embodiments, the present disclosure relates to a method for reducing capacitive loading in a power amplifier system. The method includes generating a supply voltage for a plurality of power amplifiers using an envelope tracker, the plurality of power amplifiers including a first power amplifier and a second power amplifier. The method further includes disabling the first power amplifier and enabling the second power amplifier using a bias control module. The method further includes electrically floating an end of a first decoupling capacitor associated with the first power amplifier using a first switch so as to reduce a capacitive loading of the envelope tracker when the first power amplifier is disabled.

In various embodiments, the method further includes grounding an end of a second decoupling capacitor associated with the second power amplifier using a second switch so as to provide bypass capacitance to the second power when the second power amplifier is enabled.

According to several embodiments, the method further includes providing a field-effect transistor between a ground node and an end of a second decoupling capacitor associated with the second power amplifier. In some embodiments, the method further includes biasing a gate of the field-effect transistor using the bias control module so as to provide a dampening resistor for suppressing oscillations of the second power amplifier.

In certain embodiments, the present disclosure relates to a mobile device including a plurality of power amplifiers, a means for envelope tracking, a first switchable capacitor, and a first means for switching. The plurality of power amplifiers includes a first power amplifier configured to amplify a first radio frequency (RF) signal. The first power amplifier has an enabled state and a disabled state. The means for envelope tracking is configured to generate a supply voltage for a first supply node used to electrically power the plurality of power amplifiers. The first switchable capacitor is operatively associated with the first power amplifier and has a first end and a second end, the first end electrically connected to the first supply node. The first switching means is operatively associated with the first power amplifier and is configured to control a voltage of the second end of the first switchable capacitor. The first switching means is configured to electrically float the second end of the first switchable capacitor when the first power amplifier is disabled so as to reduce a capacitive loading of the means for envelope tracking.

DETAILED DESCRIPTION OF EMBODIMENTS

The headings provided herein, if any, are for convenience only and do not necessarily affect the scope or meaning of the claimed invention.

Provided herein are various non-limiting examples of devices and methods for facilitating amplification of a radio frequency (RF) signal.

Figure 1:
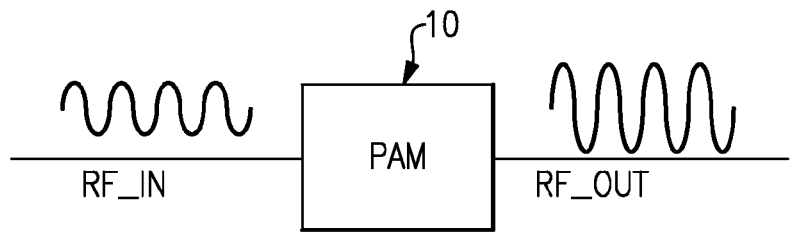
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF input signal RF_IN to generate an amplified RF output signal RF_OUT. As described herein, the power amplifier module 10 can include one or more power amplifiers.

Figure 2:
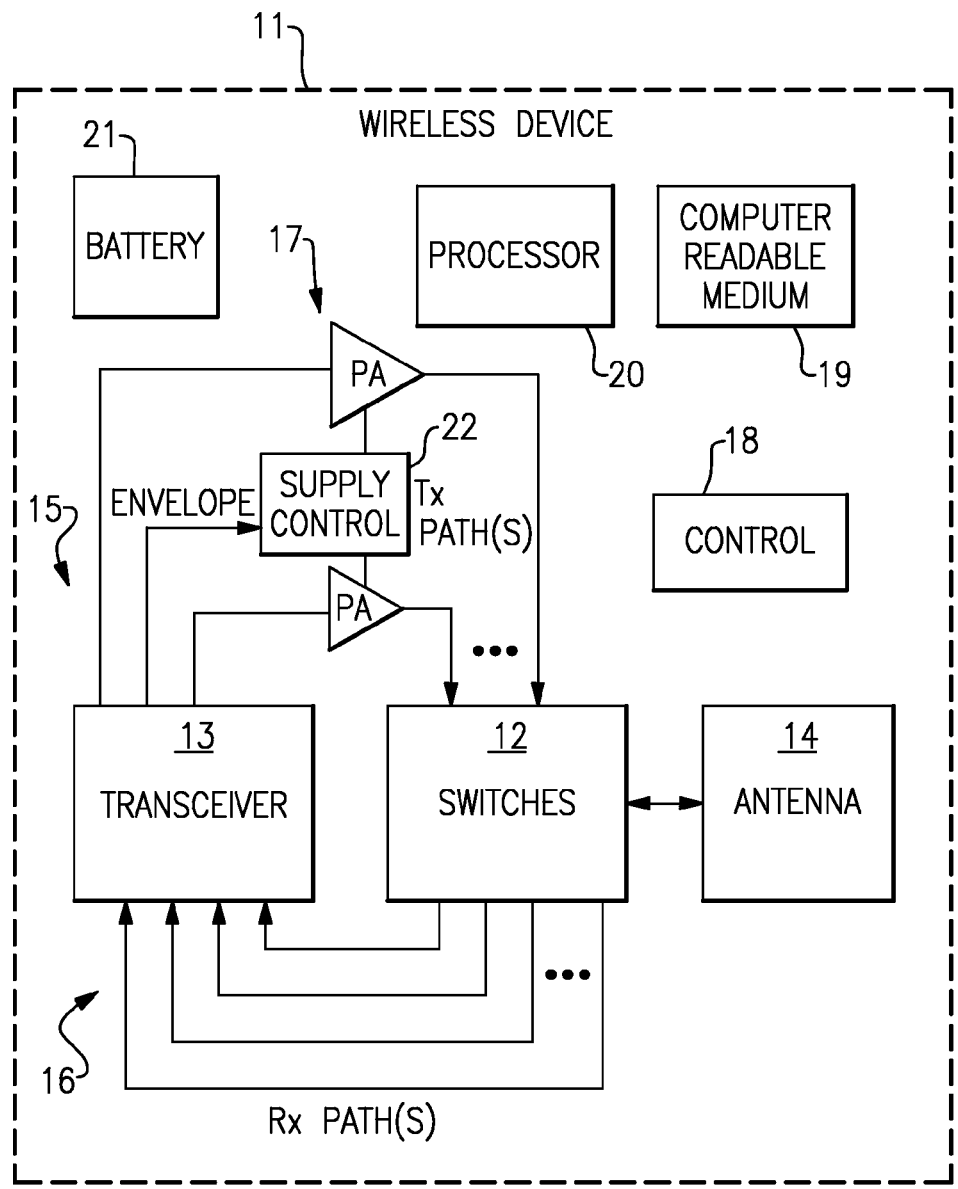
FIG. 2 is a schematic block diagram of an example wireless device that can include one or more of the power amplifier modules of FIG. 1.

FIG. 2 is a schematic block diagram of an example mobile or wireless device 11 that can include one or more of the power amplifier modules 10 of FIG. 1. The wireless device 11 can implement one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and LTE Advanced are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to vary the supply voltage provided to the power amplifiers 17 based upon an envelope of the RF signal to be amplified. However, in certain embodiments the supply control block 22 can include different components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by controlling a voltage level of the power supply provided to the power amplifiers, the power consumed from the battery 21 can be reduced, thereby improving the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

Figure 3:
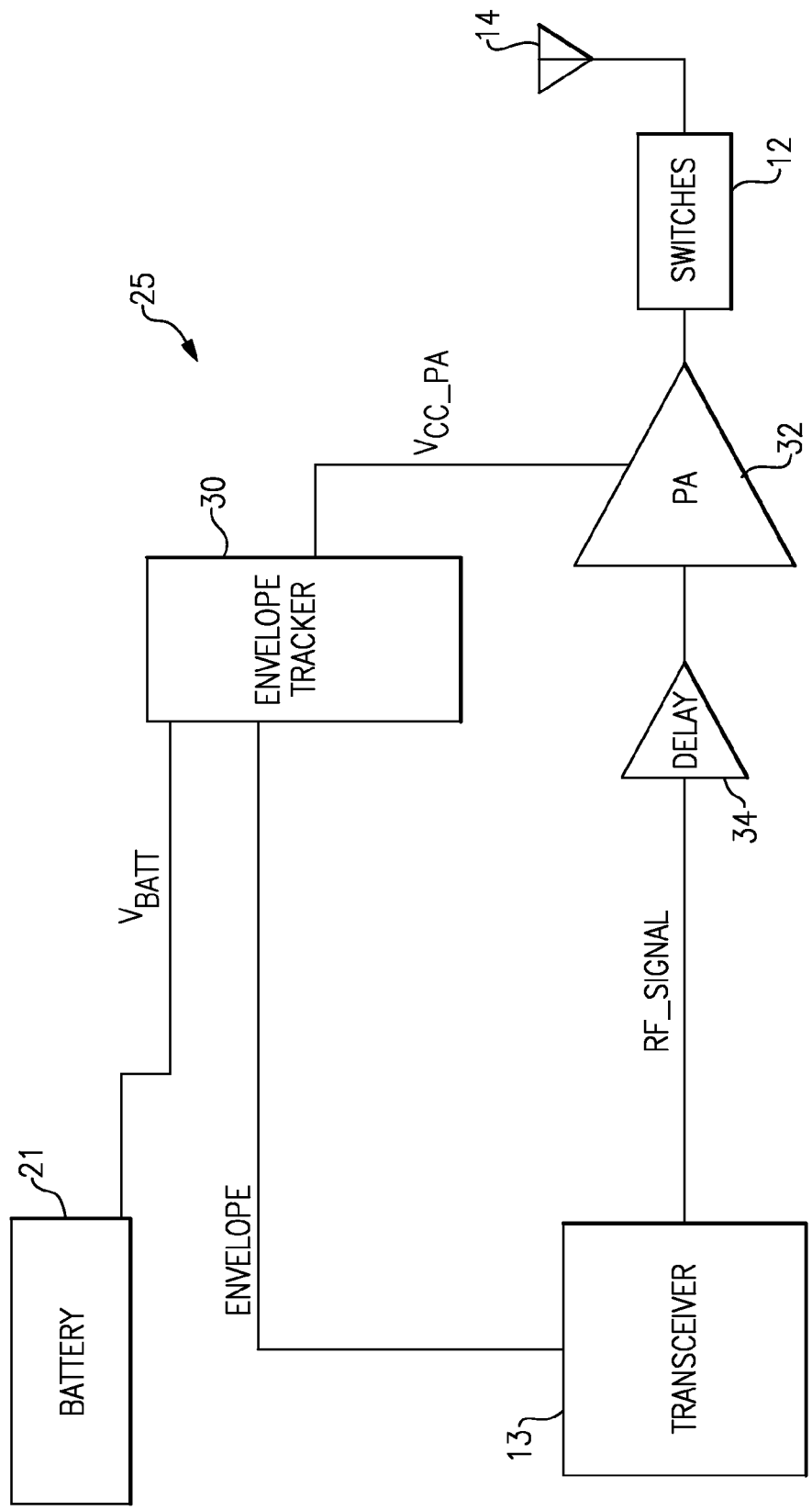
FIG. 3 is a schematic block diagram of one example of a power amplifier system having an envelope tracker.

FIG. 3 is a schematic block diagram of one example of a power amplifier system 25 having an envelope tracker 30. The illustrated power amplifier system 25 includes the switches 12, the transceiver 13, the antenna 14, the battery 21, an envelope tracker 30, a power amplifier 32, and a delay element 34.

The transceiver 13 can generate an RF signal RF_SIGNAL, which can be provided to a delay element 34. The delay element 34 can be used to delay the RF signal RF_SIGNAL so as to compensate for time associated with generating a power amplifier supply voltage $V_{CC\_PA}$ for the power amplifier 32, as will be described below. The power amplifier 32 can amplify the delayed RF signal and provide the amplified signal to an input of the switches 12. The switches 12 can have an output electrically connected to the antenna 14. Although not illustrated in FIG. 3, more or fewer power amplifiers can be electrically connected to the antenna 14 through the switches 12 to aid in providing desired number of transmit and/or receive paths.

The transceiver 13 can provide the envelope of the RF signal to the envelope tracker 30. The envelope tracker 30 can also receive a battery voltage $V_{BATT}$ from the battery 21. The envelope tracker 30 can be used to change a voltage level of the power amplifier supply voltage $V_{CC\_PA}$ in relation to the envelope of the RF signal.

Although the transceiver 13 is illustrated as providing the envelope signal to the envelope tracker 30, the envelope signal can be generated in other ways. Additionally, although FIG. 3 illustrates a configuration in which the delay element 34 is disposed in a signal path between the RF signal RF_SIGNAL and the input of the power amplifier 32, in other configurations, the delay element 34 can be omitted altogether or configured in other ways. For example, in some implementations the RF signal RF_SIGNAL can have a greater delay than the envelope signal, and the delay element 34 can be used to delay the envelope signal provided to the envelope tracker 30.

Figure 4A:
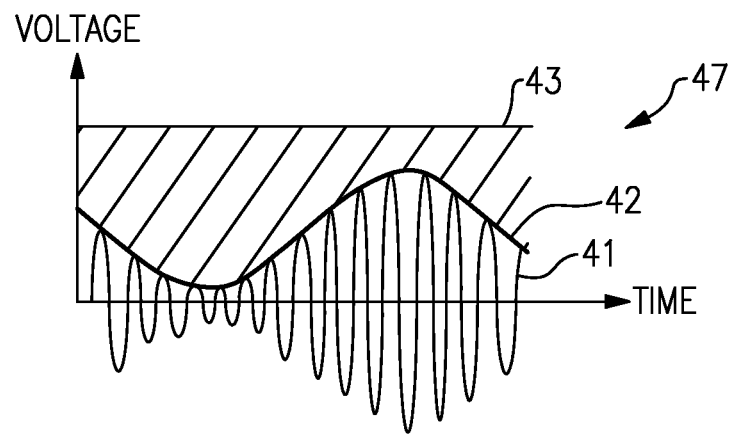
FIGS. 4A-4B show two examples of a power supply voltage versus time.
Figure 4B:
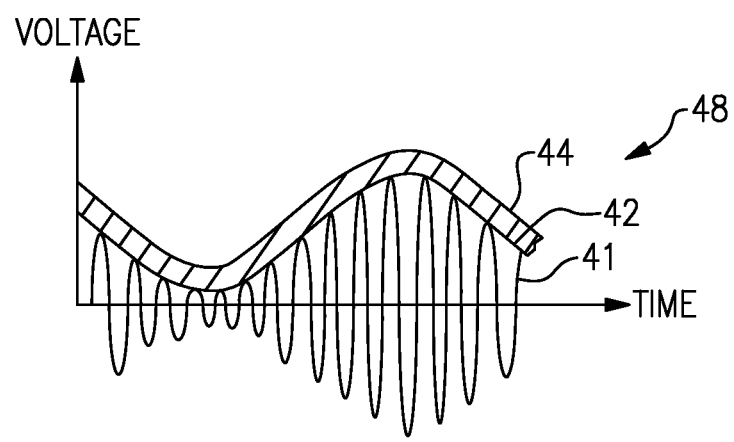

FIGS. 4A-4B show two examples of a power supply voltage versus time.

In FIG. 4A, a graph 47 illustrates the voltage of an RF signal 41 and a power amplifier supply voltage 43 versus time. The RF signal 41 has an envelope 42.

In certain implementations, the power supply voltage 43 of a power amplifier can have a voltage greater than that of the RF signal 41. For example, providing a power supply voltage to a power amplifier having a magnitude less than that of the RF signal 41 can clip the RF signal, thereby creating signal distortion and/or other problems. Thus, the power supply voltage 43 can be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B changes in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Figure 5:
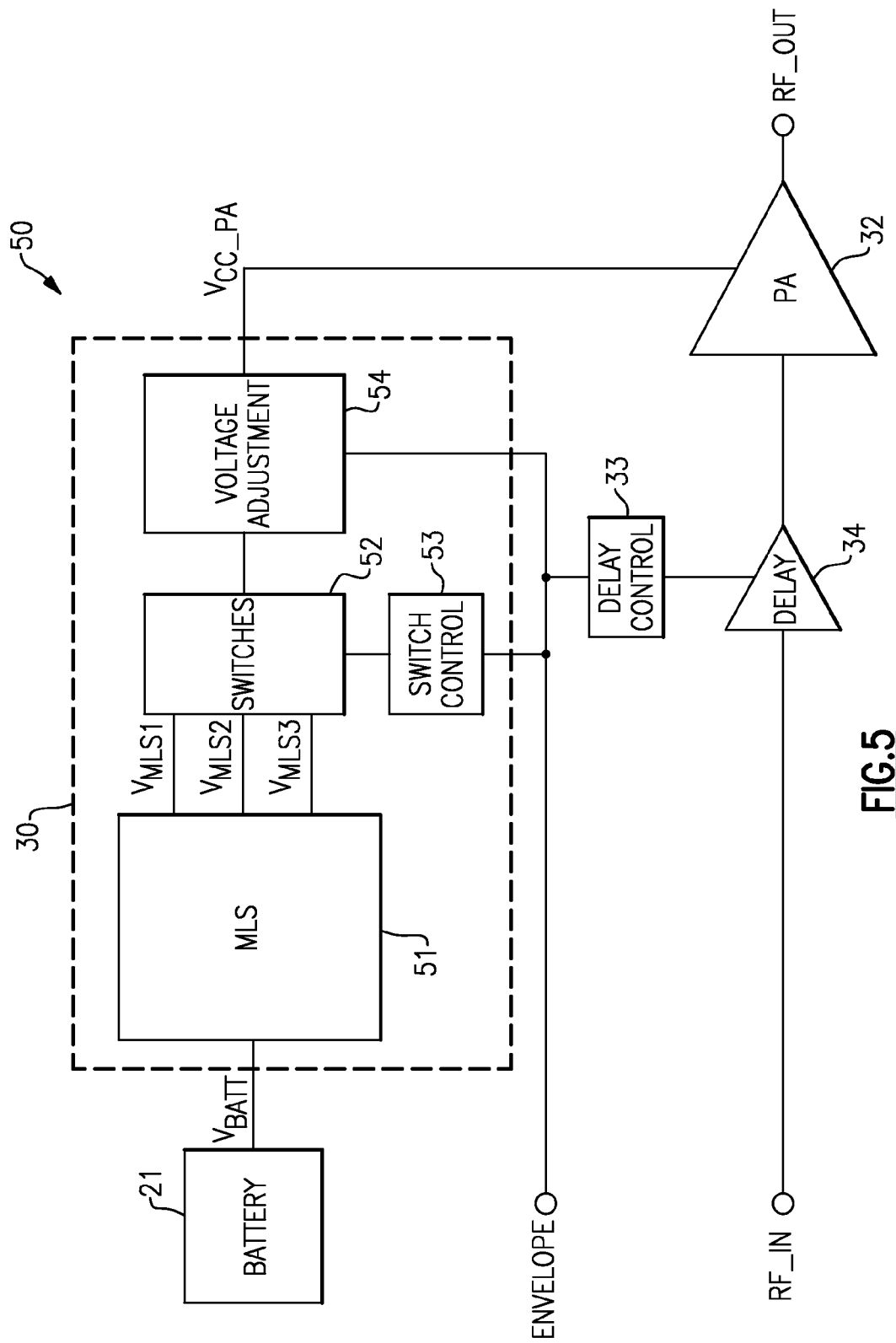
FIG. 5 is a schematic block diagram of another example of a power amplifier system having an envelope tracker.

FIG. 5 is a schematic block diagram of another example of a power amplifier system 50 including an envelope tracker 30. The illustrated power amplifier system 50 includes the battery 21, the envelope tracker 30, the power amplifier 32, a delay control block 33, and a delay element 34. The envelope tracker 30 includes a multi-level supply control block 51, switches 52, switch control 53, and a voltage adjustment module 54.

As shown in FIG. 5, the example power amplifier system 50 can receive an RF input signal RF_IN and an envelope signal, and can use the envelope signal to generate a supply voltage $V_{CC\_PA}$ for the power amplifier 32. In order to compensate for delays in generating the power amplifier supply voltage $V_{CC\_PA}$, the delay element 34 and the delay control block 33 can be included. For example, the delay control block 33 can be used to control the delay of the delay element 34 based on the envelope of the RF signal to help align the power amplifier supply voltage $V_{CC\_PA}$ and the RF signal amplified by the power amplifier 32.

The multi-level supply control block 51 can be included in the envelope tracker 30, and can be used to generate a plurality of substantially DC output voltages from the battery 21. For example, the multi-level supply control block 51 can be used to generate output voltages $V_{MLS1}$, $V_{MLS2}$ and $V_{MLS3}$ from the battery voltage $V_{BATT}$. Although the multi-level supply control block 51 is illustrated as generating three output voltages, the multi-level supply control block 51 can be configured to generate more or fewer output voltages. The multi-level supply control block 51 can include, for example, a buck-boost converter or any other suitable DC-to-DC converter.

The switch control block 53 can be configured to select amongst the output voltages generated by the multi-level supply control block 51. The voltage selected by the switch control block 53 can be adjusted by a voltage adjustment module 54 before being provided to one or more power amplifiers, such as the power amplifier 32. For example, the voltage adjustment module 54 can include an amplifier configured to provide linear tracking of the envelope signal to generate the power amplifier supply voltage $V_{CC\_PA}$. In certain implementations, the voltage adjustment module 54 can include an amplifier and an adder, and the adder can generate the power amplifier supply voltage $V_{CC\_PA}$ by adding an error signal from the amplifier to the output voltage selected by the switches 52.

By providing both the multi-level supply control block 51 and the voltage adjustment module 54, constraints on the design of the envelope tracker 30 can be reduced, thereby permitting a system with greater flexibility and improved power efficiency. However, other configurations of the envelope tracker 30 can be used.

Figure 6:
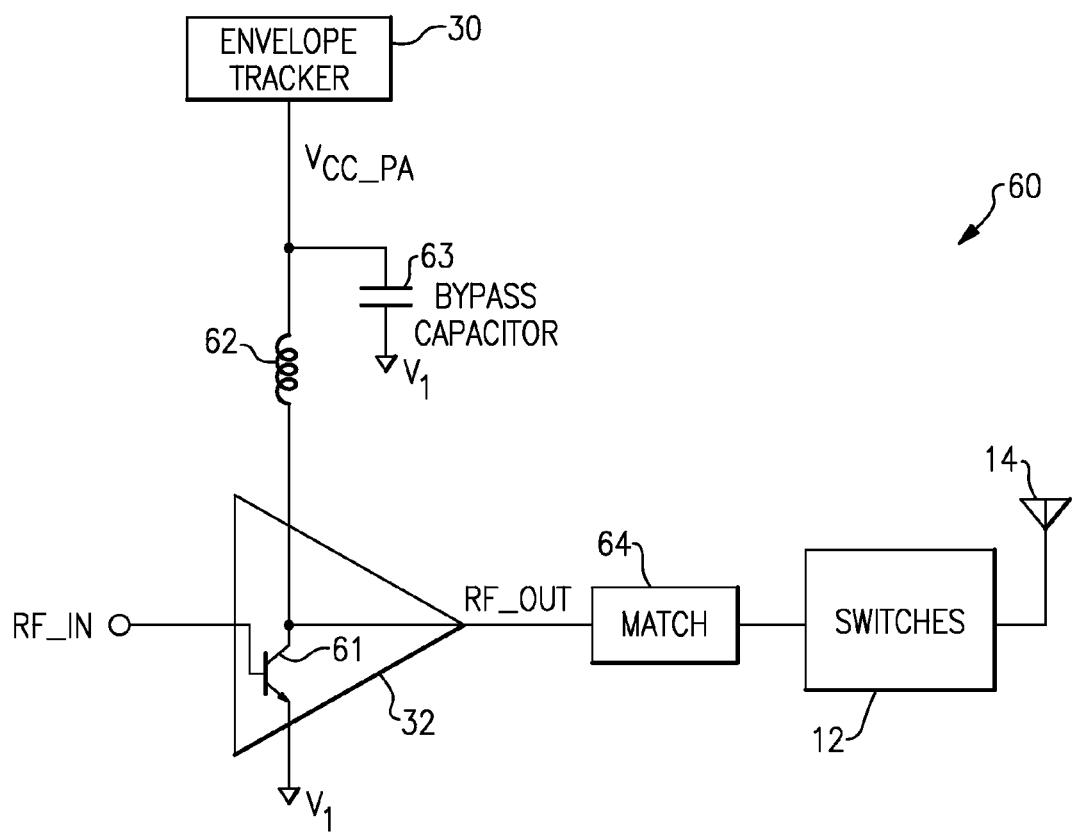
FIG. 6 is a schematic block diagram of yet another example of a power amplifier system having an envelope tracker.

FIG. 6 is a schematic block diagram of yet another example of a power amplifier system 60 having an envelope tracker 30. The illustrated power amplifier system 60 includes the envelope tracker 30, the power amplifier 32, an inductor 62, a decoupling or bypass capacitor 63, an impedance matching block 64, the switches 12, and the antenna 14. The illustrated envelope tracker 30 is configured to receive an envelope of the RF signal and to generate a power amplifier supply voltage $V_{CC\_PA}$ for the power amplifier 32.

The illustrated power amplifier 32 includes a bipolar transistor 61 having an emitter, a base, and a collector. The emitter of the bipolar transistor 61 can be electrically connected to a first voltage supply $V_1$, which can be, for example, a ground node. Additionally, a RF input signal RF_IN can be provided to the base of the bipolar transistor 61. The bipolar transistor 61 can amplify the RF input signal RF_IN and provide the amplified RF signal RF_OUT at the collector. The bipolar transistor 61 can be any suitable device. In one implementation, the bipolar transistor 61 is a heterojunction bipolar transistor (HBT).

The power amplifier 32 can be configured to provide the amplified RF signal RF_OUT to the switches 12. The impedance matching block 64 can be used to aid in terminating the electrical connection between the power amplifier 32 and the switches 12. For example, the impedance matching block 64 can be used to increase power transfer and/or reduce reflections of the amplified RF signal generated using the power amplifier 32.

The inductor 62 can be used to provide the power amplifier supply voltage $V_{CC\_PA}$ to the power amplifier 32 while choking or blocking high frequency RF signal components. The inductor 62 can include a first end electrically connected to the envelope tracker 30, and a second end electrically connected to the collector of the bipolar transistor 61.

The decoupling or bypass capacitor 63 includes a first end electrically connected to the first end of the inductor 62 and a second end electrically coupled to the first supply voltage $V_1$. The decoupling capacitor 63 can provide a low impedance path to high frequency signals, thereby reducing the noise of the power amplifier supply voltage $V_{CC\_PA}$, improving power amplifier stability, and/or improving the performance of the inductor 62 as a RF choke.

Although FIG. 6 illustrates one implementation of the power amplifier 32, skilled artisans will appreciate that the teachings described herein can be applied to a variety of power amplifier structures, such as multi-stage power amplifier structures and power amplifiers employing other transistor structures. For example, in some implementations the bipolar transistor 61 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

Figure 7:
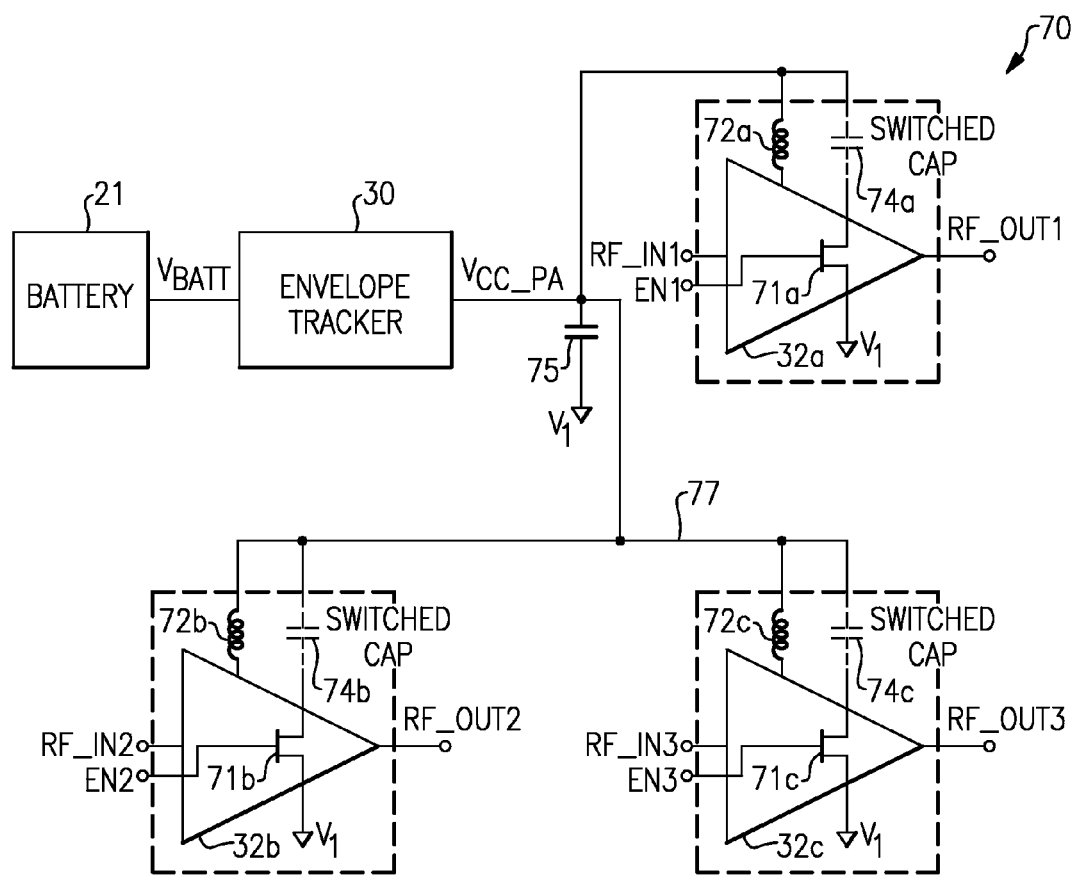
FIG. 7 is a schematic diagram of a power amplifier system in accordance with one embodiment.

FIG. 7 is a schematic diagram of a power amplifier system 70 in accordance with one embodiment. The power amplifier system 70 includes the battery 21, the envelope tracker 30, first to third power amplifiers 32a-32c, first to third field-effect transistors (FETs) 71a-71c, first to third inductors 72a-72c, first to third switched or switchable capacitors 74a-74c, and an envelope tracking capacitor 75.

The first power amplifier 32a includes an input for receiving a first RF input signal RF_IN1 and an output for generating the first amplified RF output signal RF_OUT1. Additionally, the second power amplifier 32b includes an input for receiving a second RF input signal RF_IN2 and an output for generating the second amplified RF output signal RF_OUT2, and the third power amplifier 32c includes an input for receiving a third RF input signal RF_IN3 and an output for generating the third amplified RF output signal RF_OUT3.

The first, second and third power amplifiers 32a-32c each are configured to receive an enable signal, which can be used to switch each of the power amplifiers between an enabled state and a disabled state. For example, the first power amplifier 32a is configured to receive a first enable signal EN1, the second power amplifier 32b is configured to receive a second enable signal EN2, and the third power amplifier 32c is configured to receive a third enable signal EN3. Although FIG. 7 illustrates a configuration using three power amplifiers, the power amplifier system 70 can be modified to include more or fewer power amplifiers.

The envelope tracker 30 includes an input configured to receive a battery voltage $V_{BATT}$ from the battery 21, and an output configured to generate a power amplifier supply voltage $V_{CC\_PA}$ for the first to third power amplifiers 32a-32c. The power amplifier supply voltage $V_{CC\_PA}$ can be distributed to the first to third power amplifiers 32a-32c using the $V_{CC\_PA}$ supply node or network 77.

The power amplifier system 70 can include the first to third switched capacitors 74a-74c and the first to third FETs 71a-71c. Each of the first to third FETs 71a-71c includes a gate, a source, and a drain. The first switched capacitor 74a includes a first end electrically connected to the $V_{CC\_PA}$ supply node 77 and a second end electrically connected to the drain of the first FET 71a. Similarly, the second switched capacitor 74b includes a first end electrically connected to the $V_{CC\_PA}$ supply node 77 and a second end electrically connected to the drain of the second FET 71b, and the third switched capacitor 74c includes a first end electrically connected to the $V_{CC\_PA}$ supply node 77 and a second end electrically connected to the drain of the third FET 71c. The sources of the first to third FETs 71a-71c are electrically connected to the first supply voltage $V_1$, and the gates of the first, second and third FETs 71a-71c are configured to receive the first enable signal EN1, the second enable signal EN2, and the third enable signal EN3, respectively.

The envelope tracker 30 can control the power amplifier supply voltage $V_{CC\_PA}$ based on the envelope of an RF signal associated with an enabled power amplifier. For example, when the first enable signal EN1 indicates that the first power amplifier 32a is enabled, the envelope tracker 30 can change the power amplifier supply voltage $V_{CC\_PA}$ in relation to the envelope of the first RF input signal RF_IN1. Similarly, when the second enable signal EN2 indicates that the second power amplifier 32b is enabled, the envelope tracker 30 can change the power amplifier supply voltage $V_{CC\_PA}$ in relation to the envelope of the second RF input signal RF_IN2. Additionally, when the third enable signal EN3 indicates that the third power amplifier 32c is enabled, the envelope tracker 30 can change the power amplifier supply voltage $V_{CC\_PA}$ in relation to the envelope of the third RF input signal RF_IN3. Including multiple power amplifiers permits the power amplifier system 70 to provide functionalities associated with, for example, switching between different bands and/or switching between different power modes.

The envelope tracking capacitor 75 includes a first end electrically connected to the $V_{CC\_PA}$ supply node 77 and a second end electrically connected to the first supply voltage $V_1$, which can be, for example, a ground node. The envelope tracking capacitor 75 can aid in reducing noise on the $V_{CC\_PA}$ supply node 77, such as noise associated with the operation of the power amplifiers 32a-32c. The first to third inductors 72a-72c can each include a first end electrically connected to the $V_{CC\_PA}$ supply node 77 and a second end electrically connected to the first to third power amplifiers 32a-32c, respectively. Inclusion of the first to third inductors 72a-72c can aid in electrically powering the first to third power amplifiers 32a-32c while permitting isolation between the $V_{CC\_PA}$ supply node 77 and the amplified RF signals generated by the first to third power amplifiers 32a-32c.

Capacitive loading of the $V_{CC\_PA}$ supply node 77 can result in the envelope tracker 30 having a relatively large size and/or reduced power efficiency. However, a relatively large capacitance can be needed local to each of the first to third power amplifiers 32a-32c to aid in reducing noise on the $V_{CC\_PA}$ supply node 77 and/or to aid in providing stability to the power amplifiers. For example, failure to provide sufficient capacitance on the $V_{CC\_PA}$ supply node 77 for a power amplifier can result in the power amplifier generating unwanted output oscillations and/or exhibiting other undesirable effects.

Providing the first to third switched capacitors 74a-74c and associated switches, such as the first to third FETs 71a-71c, can aid in reducing the capacitive load of the envelope tracker 30, while providing sufficient decoupling capacitance for the operation of the first to third power amplifiers 31a-31c. Since in some configurations only one of the first to third power amplifiers 31a-31c is enabled at a time, a switch associated with the enabled power amplifier can be set in an ON or low-impedance state to provide decoupling capacitance for the enabled power amplifier. However, when a particular power amplifier is disabled, the switch associated with the disabled power amplifier can be set in an OFF or high-impedance state, thereby reducing the capacitive load on the envelope tracker 30 and improving efficiency of the power amplifier system 70. In certain implementations, the switched capacitor scheme described herein can be used to reduce the value of the envelope tracking capacitor 75 of the power amplifier system, or can be used to eliminate the envelope tracking capacitor 75 from the power amplifier system 70 altogether.

In the illustrated configuration, the first to third FETs 71a-71c operate as switches for selectively including the first to third capacitors 74a-74c, respectively, as capacitive loads on the $V_{CC\_PA}$ supply node 77. For example, when a given power amplifier is enabled, the associated FET can be in a low-impedance state and can provide a voltage equal to about that of the first supply voltage $V_1$ at the second end of an associated switched capacitor. When the second end of an associated switched capacitor is electrically connected to the first supply voltage $V_1$, the switched capacitor can operate as a bypass capacitor for an associated power amplifier. However, when a field-effect transistor is in a high-impedance state, the second end of the associated switching capacitor can be electrically floating, and therefore the capacitive loading on the $V_{CC\_PA}$ supply node 77 can be decreased.

In some implementations, the first to third switched capacitors 74a-74c are each implemented using a single component. However, other configurations are possible, such as implementations in which the first to third switched capacitors 74a-74c each include multiple components. For example, in one embodiment the first to third switched capacitors 74a-74c each include a bank of capacitors.

As illustrated in FIG. 7, the first to third FETs 71a-71c operate as switches for the first to third switched capacitors 74a-74c. However, persons of ordinary skill in the art will appreciate that other switches can be used in accordance with the capacitive load reduction schemes described herein. For example, in some implementations, each of the first to third FETs 71a-71c are omitted in favor of using a pin diode configured to have an impedance that changes based on an applied control voltage.

Figure 8:
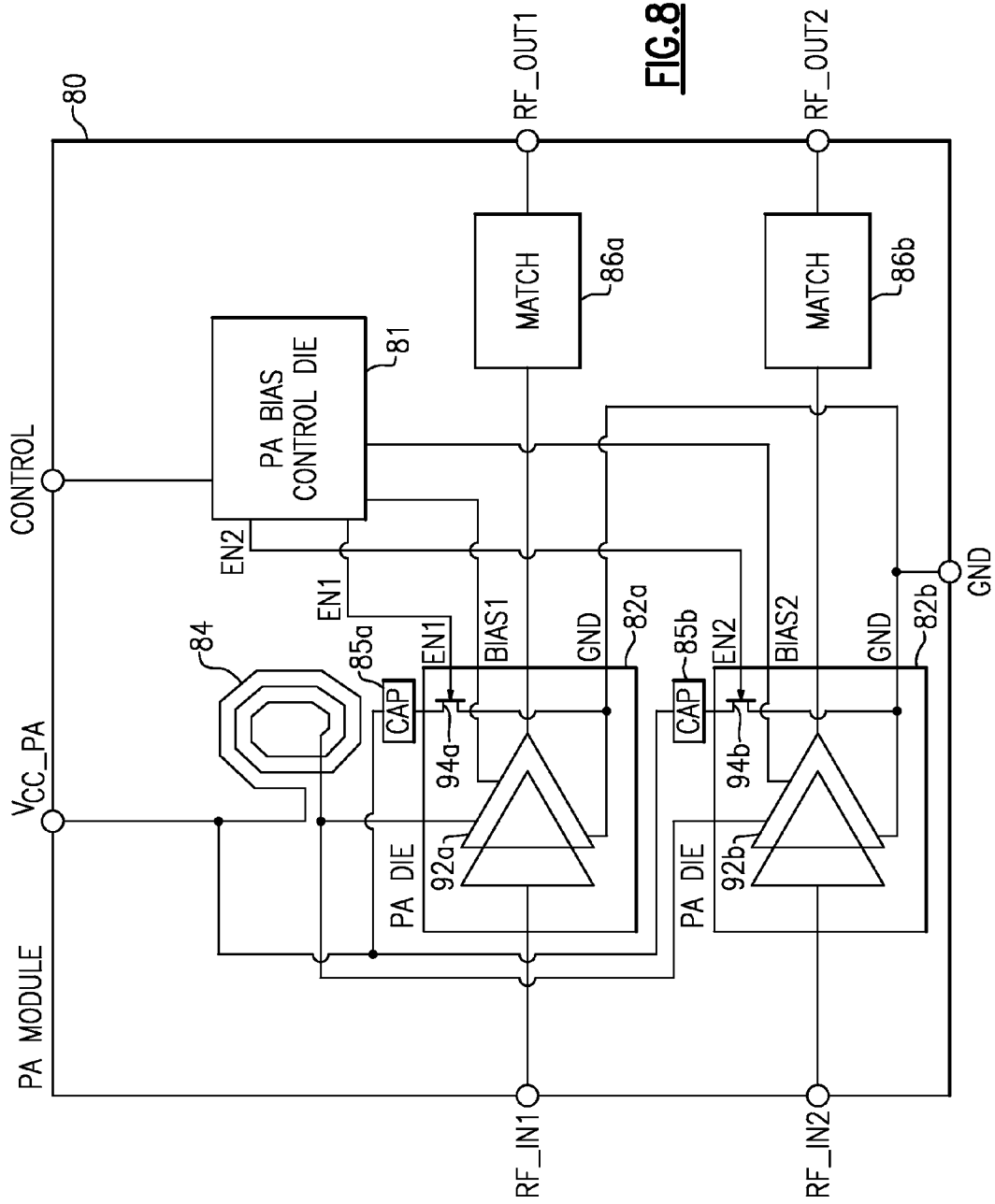
FIG. 8 is a schematic diagram of a multi-chip module in accordance with one embodiment.

FIG. 8 is a schematic diagram of a multi-chip module (MCM) 80 in accordance with one embodiment. The illustrated MCM 80 includes a bias control die 81, first and second power amplifier dies 82a, 82b, an inductor 84, first and second switched capacitors 85a, 85b, and first and second impedance matching networks 86a, 86b.

The MCM 80 further includes a power amplifier supply voltage pin $V_{CC\_PA}$, a first RF input signal pin RF_IN1, a second RF input signal pin RF_IN2, a first RF output signal pin RF_OUT1, a second RF output signal pin RF_OUT2, a control pin CONTROL, and a ground pin GND. In certain implementations, the power supply pin $V_{CC\_PA}$ can be electrically connected to an envelope tracker, such as an envelope tracking module disposed on a phone board on which the MCM 80 can be mounted. Additionally, although not illustrated in FIG. 8 for clarity, the MCM 80 can include additional pins, such as one or more input pins, control pins, harmonic termination pins, and/or other supply pins, including, for example, a supply pin associated with power amplifier input stages.

The MCM 80 includes the inductor 84, which can be disposed in a signal path between the power amplifier supply voltage pin $V_{CC\_PA}$ and supply inputs of the first and second power amplifier dies 82a, 82b. Although the configuration illustrated in FIG. 8 shows the inductor 84 being used to provide both the first and second power amplifier dies 82a, 82b with a supply voltage, in other implementations separate inductors can be used to supply each of the first and second power amplifier dies 82a, 82b. The inductor 84 can be formed, for example, by trace on the MCM 80. However, the inductor 84 can be formed in other ways, such as by use of one or more surface mount components.

The first power amplifier die 82a includes a first power amplifier 92a and a first FET 94a, and the second power amplifier die 82b includes a second power amplifier 92b and a second FET 94b. The first power amplifier 92a includes an input electrically connected to the first RF input signal pin RF_IN1, and the second power amplifier 92b includes an input electrically connected to the second RF input signal pin RF_IN2. Additionally, the first power amplifier 92a includes an output electrically connected to the first RF output signal pin RF_OUT1 through the first impedance matching circuit 86a, and the second power amplifier 92b includes an output electrically connected to the second RF output signal pin RF_OUT2 through the second impedance matching circuit 86b. The first and second power amplifiers 92a, 92b can be used to amplify RF signals received on the first and second RF input signal pins RF_IN1, RF_IN2, respectively, to generate amplified RF signals on the RF output signal pins RF_OUT1, RF_OUT2.

The first and second power amplifier dies 82a, 82b can be electrically powered using the power amplifier supply voltage pin $V_{CC\_PA}$ and the ground pin GND. For example, the first power amplifier 92a is electrically connected to the power amplifier supply voltage pin $V_{CC\_PA}$ through the inductor 84 and to the ground pin GND. Similarly, the second power amplifier 92b is electrically connected to the power amplifier supply voltage pin $V_{CC\_PA}$ through the inductor 84 and to the ground pin GND. In one embodiment, the first and second power amplifier dies 82a, 82b are gallium arsenide (GaAs) dies formed using a bipolar field-effect transistors (BiFET) process.

The first and second impedance matching networks 86a, 86b can be used to aid in terminating the electrical connection between the outputs of the first and second power amplifiers 92a, 92b and the first and second RF output pins RF_OUT1, RF_OUT2, respectively. The first and second impedance matching networks 86a, 86b can also be configured to achieve a desired load line impedance characteristic versus frequency for the first and second power amplifiers 92a, 92b, respectively. In certain configurations, the first and second impedance matching networks 92a, 92b each include an inductive component and a capacitive component. The inductive component can be formed, for example, using trace disposed on the MCM 80, using one or more bond wires, and/or using one or more surface mount components. The capacitive component can be formed, for example, using one or more surface mount components.

The PA bias control die 81 is electrically connected to the control pin CONTROL, and can be used, for example, to enable and disable one or more amplifiers and/or to provide bias or control signals to the power amplifiers. For example, in the illustrated configuration, the PA bias control die 81 is configured to generate a first enable signal EN1 for the first power amplifier die 82a, a first bias signal BIAS1 for the first power amplifier die 82a, a second enable signal EN2 for the second power amplifier die 82*b*, and a second bias signal BIAS2 for the second power amplifier die 82*b*.

In one embodiment, the first and second power amplifier dies 82*a*, 82*b* include bipolar transistors, and the first and second bias signals BIAS1, BIAS2 are each a reference voltage for biasing a current mirror used to generate a base current for the bipolar transistors. Additionally, the first and second enable signals EN1, EN2 can be used as control signals used to selectively enable or disable the operation of the current mirrors.

The first and second switched capacitors 85*a*, 85*b* each include a first end and a second end. The first end of each of the first and second switched capacitors 85*a*, 85*b* is electrically connected to the power amplifier supply voltage pin $V_{CC\_PA}$ of the MCM 80. The first and second switched capacitors 85*a*, 85*b* can be, for example, surface mount components mounted on the MCM 80.

The first FET 94*a* includes a drain electrically connected to the second end of the first switched capacitor 85*a*, and the second FET 94*b* includes a drain electrically connected to the second end of the second switched capacitor 85*b*. The first FET 94*a* further includes a gate electrically connected to the first enable signal EN1 and a source electrically connected to the ground pin GND. The second FET 94*b* further includes a gate electrically connected to the second enable signal EN2 and a source electrically connected to the ground pin GND. In one embodiment, the first and second FETs 94*a*, 94*b* are formed on the power amplifier dies 82*a*, 82*b*.

The first and second switched capacitors 85*a*, 85*b*, can be selectively included as capacitive loads of the power amplifier supply voltage pin $V_{CC\_PA}$ in a manner similar to that described above with respect to FIG. 7. For example, the first enable signal EN1 can be used to create a low impedance or high impedance path through a channel of the first FET 94*a*, thereby selectively grounding the second end of the first switched capacitor 85*a*. Similarly, the second enable signal EN2 can be used to create a low impedance or high impedance path through the second FET 94*b*, thereby selectively grounding the second end of the second switched capacitor 85*b*.

Although FIG. 8 illustrates the MCM 80 as including the first and second power amplifier dies 82*a*, 82*b* the MCM 80 can be modified to include more or fewer power amplifier dies. Additionally, in certain implementations, certain components and/or pins can be omitted from the MCM 80, while other components and/or pins can be added.

In one embodiment, the power amplifier bias control die 81 is configured to generate a first control signal and a second control signal for biasing the gates of the first and second FETs 94*a*, 94*b*, respectively. As will be described in detail further below with respect to FIG. 11, when a particular power amplifier is enabled, an associated FET can be biased to have a channel resistance suitable for dampening oscillations of the power amplifier, thereby improving stability.

Figure 9A:
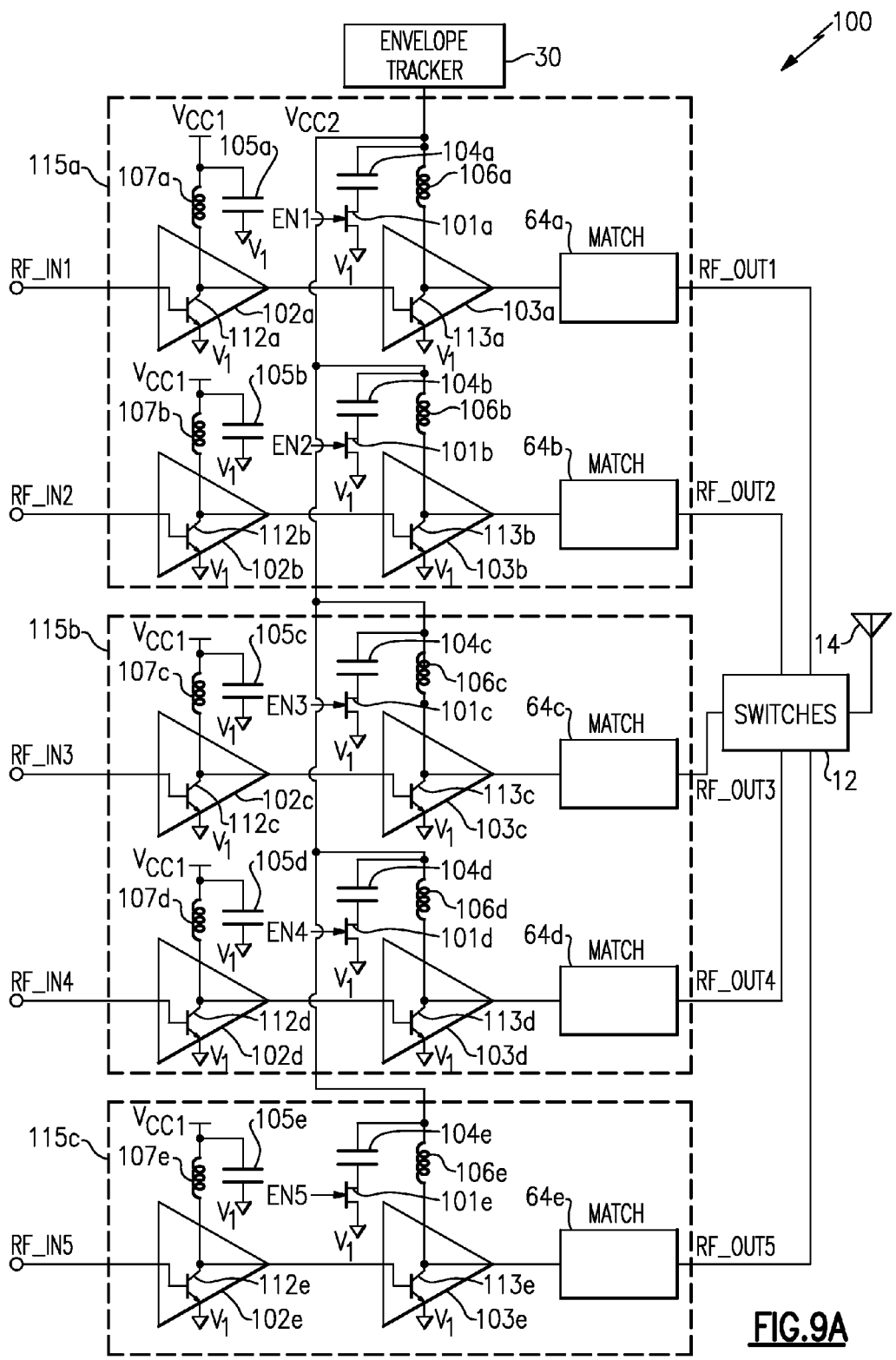
FIG. 9A is a schematic diagram of a power amplifier system in accordance with another embodiment.

FIG. 9A is a schematic diagram of a power amplifier system 100 in accordance with another embodiment. The illustrated power amplifier system 100 includes the switches 12, the antenna 14, the envelope tracker 30, first to fifth input stages 102*a*-102*e*, first to fifth output stages 103*a*-103*e*, first to fifth impedance matching blocks 64*a*-64*e*, first to fifth switched capacitors 104*a*-104*e*, first to fifth FETs 101*a*-101*e*, first to fifth output stage inductors 106*a*-106*e*, first to fifth input stage inductors 107*a*-107*e*, and first to fifth capacitors 105*a*-105*e*.

The first to fifth input stages 102*a*-102*e* and the first to fifth output stages 103*a*-103*e* have been configured to operate as a plurality of multi-stage power amplifiers. For example, the first input stage 102*a* and the first output stage 103*a* operate as a first power amplifier configured to amplify a first RF signal RF_IN1 to generate a first amplified RF signal RF_OUT1. Additionally, the second input stage 102*b* and the second output stage 103*b* operate as a second power amplifier configured to amplify a second RF signal RF_IN2 to generate a second amplified RF signal RF_OUT2. Furthermore, the third input stage 102*c* and the third output stage 103*c* operate as a third power amplifier configured to amplify a third RF signal RF_IN3 to generate a third amplified RF signal RF_OUT3. Additionally, the fourth input stage 102*d* and the fourth output stage 103*d* operate as a fourth power amplifier configured to amplify a fourth RF signal RF_IN4 to generate a fourth amplified RF signal RF_OUT4. Furthermore, the fifth input stage 102*e* and the fifth output stage 103*e* operate as a fifth power amplifier configured to amplify a fifth RF signal RF_IN5 to generate a fifth amplified RF signal RF_OUT5.

The first to fifth input stages 102*a*-102*e* include first to fifth input bipolar transistors 112*a*-112*e*, respectively. Additionally, the first to fifth output stages 103*a*-103*e* include first to fifth output bipolar transistors 113*a*-113*e*, respectively. The bases of the first to fifth input bipolar transistors 112*a*-112*e* are configured to receive the first to fifth RF signals RF_IN1 to RF_IN5, respectively. Additionally, the emitters of each of the first to fifth input bipolar transistors 112*a*-112*e* and the first to fifth output bipolar transistor 113*a*-113*e* are each electrically connected to a first voltage supply $V_1$, which can be, for example, a ground node. The collectors of the first to fifth input bipolar transistors 112*a*-112*e* are electrically connected to the bases of the first to fifth output bipolar transistors 113*a*-113*e*, respectively. Additionally, the collectors of the first to fifth output bipolar transistors 113*a*-113*e* are electrically connected to first to fifth inputs of the switches 12 through first to fifth impedance matching blocks 64*a*-64*e*, respectively. The switches 12 further include an output electrically connected to the antenna 14, and can be used to provide one of the first to fifth amplified RF output signals RF_OUT1 to RF_OUT5 to the antenna 14.

As described above, the first to fifth input stages 102*a*-102*e* and the first to fifth output stages 103*a*-103*e* have been configured to amplify the first to fifth RF signals RF_IN1 to RF_IN5 to generate first to fifth amplified RF signals RF_OUT1 to RF_OUT5, respectively. By using multi-stage power amplifiers to provide amplification, the design constraints of the power amplifiers can be reduced relatively to a design employing a single stage for each power amplifier.

The first to fifth impedance matching blocks 64*a*-64*e* can be used to aid in terminating the electrical connection between the first to fifth output stages 103*a*-103*e* and the first to fifth inputs of the switches 12, respectively. For example, first to fifth impedance matching blocks 64*a*-64*e* can be used to increase power transfer and/or reduce reflections of the first to fifth amplified RF signals RF_OUT1 to RF_OUT5 generated by the first to fifth output stages 103*a*-103*e*, respectively. Additional details of the first to fifth impedance matching blocks 64*a*-64*e* can be similar to those described earlier.

The power amplifier system 100 of FIG. 9A has been configured to use separate power supplies to electrically power the first to fifth input stages 102*a*-102*e* and the first to fifth output stages 103*a*-103*e*. For example, the first to fifth input stage inductors 107*a*-107*e* have been used to provide a first power amplifier supply voltage $V_{CC1}$ to the first to fifth input stages 102*a*-102*e*, respectively. Additionally, the first to fifth output stages inductors 106*a*-106*e* have been used to provide a second power amplifier supply voltage $V_{CC2}$ to the first to fifth output stages 103*a*-103*e*, respectively. The first to fifth input stage inductors 107a-107e and the first to fifth output stage inductors 106a-106e can be used to provide a low impedance path to the supply voltages while choking or blocking high frequency RF signals and noise. Using different power supplies to provide power to the first to fifth input stages 102a-102e and to the first to fifth output stages 103a-103e can improve the stability of the power amplifier system 100. For example, using separate supplies can isolate the first to fifth input stages 102a-102e from noise associated with the first to fifth output stages 103a-103e.

To improve the power efficiency of the power amplifier system 100, the envelope tracker 30 has been used to control a voltage level of the second power amplifier supply voltage $V_{CC2}$. As shown in FIG. 9A, in certain configurations, the first to fifth input stages 102a-102e need not have a power supply controlled by the envelope tracker 30. Rather, the first to fifth input stages 102a-102e can be electrically powered using other configurations. For example, in one embodiment, the first power amplifier supply voltage $V_{CC1}$ is a voltage from a battery. The first to fifth capacitors 105a-105e have been electrically connected between the first power amplifier supply voltage $V_{CC1}$ and the first voltage supply $V_1$ to operate as bypass capacitors for the first to fifth input stages 102a-102e, respectively.

The first to fifth FETs 101a-101e have been configured to operate as switches for selectively including the first to fifth switched capacitors 104a-104e, respectively, as bypass capacitors of the second power amplifier supply voltage $V_{CC2}$. For example, the sources of each of the first to fifth FETs 101a-101e have been electrically connected to the first voltage supply $V_1$, and the gates of the first to fifth FETs 101a-101e have been configured to receive first to fifth enable signals EN1 to EN5, respectively. Additionally, the first to fifth switched capacitors 104a-104e have been electrically connected between the sources of the first to fifth FETs 101a-101e and the first to fifth output stage inductors 106a-106e, respectively. Thus, in a manner similar to that described earlier with respect to FIG. 7, the first to fifth FETs 101a-101e can be used to selectively float an end of the first to fifth switched capacitors 104a-104e, respectively, thereby controlling a capacitive loading of the envelope tracker 30.

In certain implementations, one of the output stages 103a-103e that is associated with a signal path selected by the switches 12 is enabled and the remaining output stages are disabled to conserve power. When a particular output stage is disabled, the switched capacitor associated with the disabled output stage can be switched off, thereby reducing the capacitive load on the envelope tracker 30 and improving efficiency of the power amplifier system 100. For example, when the first to fifth enable signals EN1 to EN5 indicate that the first output stage 103a is enabled and the second to fifth output stages 103b-103e are disabled, the first FET 101a can be configured to electrically connect an end of the first switched capacitor 104a to the first voltage supply $V_1$ and to electrically float an end of each of the second to fifth switched capacitors 104b-104e. Controlling the first to fifth switched capacitors 104a-104e in this manner can reduce capacitive loading of the envelope tracker 30, while providing sufficient capacitance to meet stability specifications of the power amplifier system 100.

The illustrated power amplifier system 100 can be implemented in any suitable configuration in a wireless device, including, for example, as stand-alone dies provided on a phone board or as one or more multi-chip modules.

For example, first to third dashed boxes 115a-115c indicate one possible implementation of a grouping of the power amplifiers and switched capacitor circuitry across MCMs. For instance, a first MCM indicated by dashed box 115a can include first and second input stages 102a, 102b, first and second output stages 103a, 103b, first and second impedance matching blocks 64a, 64b, first and second switched capacitors 104a, 104b, first and second FETs 101a, 101b, first and second output stage inductors 106a, 106b, first and second input stage inductors 107a, 107b, and first and second capacitors 105a, 105b. Additionally, a second MCM indicated by dashed box 115b can include third and fourth input stages 102c, 102d, third and fourth output stages 103c, 103d, third and fourth impedance matching blocks 64c, 64d, third and fourth switched capacitors 104c, 104d, third and fourth FETs 101c, 101d, third and fourth output stage inductors 106c, 106d, third and fourth input stage inductors 107c, 107d, and third and fourth capacitors 105c, 105d. Furthermore, a third MCM indicated by dashed box 115c can include can include the fifth input stage 102e the fifth output stage 103e, the fifth impedance matching block 64e, the fifth switched capacitor 104e, the fifth FET 101e, the fifth output stage inductor 106e, the fifth input stage inductor 107e, and the fifth capacitor 105e. However, the dashed boxes 115a-115c illustrate one of many possible configurations of grouping the components on MCMs and/or other modules, and other configurations can be used.

Figure 9B:
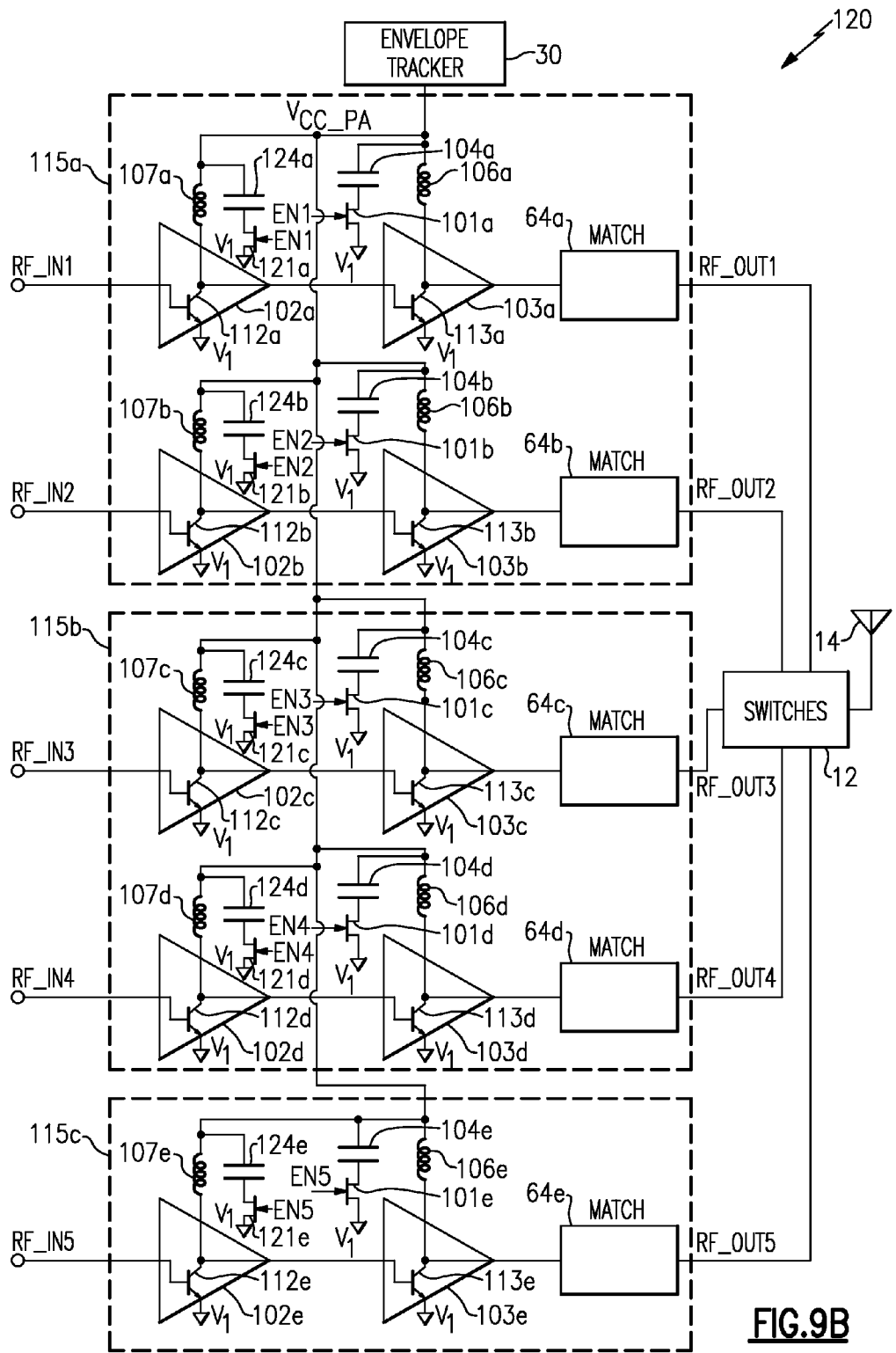
FIG. 9B is a schematic diagram of a power amplifier system in accordance with yet another embodiment.

FIG. 9B is a schematic diagram of a power amplifier system 120 in accordance with yet another embodiment. The illustrated power amplifier system 120 includes the switches 12, the antenna 14, the envelope tracker 30, the first to fifth input stages 102a-102e, the first to fifth output stages 103a-103e, the first to fifth impedance matching blocks 64a-64e, the first to fifth switched capacitors 104a-104e, the first to fifth FETs 101a-101e, the first to fifth output stage inductors 106a-106e, the first to fifth input stage inductors 107a-107e, sixth to tenth switched capacitors 124a-124e, and sixth to tenth FETs 121a-121e.

The power amplifier system 120 of FIG. 9B is similar to the power amplifier system 100 of FIG. 9A, except that the power amplifier system 120 illustrates a configuration in which the envelope tracker 30 has been used to provide a power amplifier supply voltage $V_{CC\_PA}$ to both the first to fifth output stages 103a-103e and to the first to fifth input stages 102a-102e. Additionally, to aid in reducing capacitive loading of the envelope tracker 30, the first to fifth capacitors 105a-105e of FIG. 9A have been omitted in favor of using sixth to tenth switched capacitors 124a-124e and sixth to tenth FETs 121a-121e. For example, the sources of each of the sixth to tenth FETs 121a-121e have been electrically connected to the first voltage supply $V_1$, and the gates of the sixth to tenth FETs 121a-121e have been configured to receive the first to fifth enable signals EN1 to EN5, respectively. Furthermore, the sixth to tenth switched capacitors 124a-124e have been electrically connected between the sources of the sixth to tenth FETs 121a-121e and the first to fifth input stage inductors 107a-107e. The sixth to tenth FETs 121a-121e can be used to control a capacitive loading of the envelope tracker 30 by selectively floating an end of the sixth to tenth switched capacitors 124a-124e, respectively, in a manner similar to that described earlier. Additional details of the power amplifier system 120 can be similar to those described above with respect to FIG. 9A.

Figure 10:
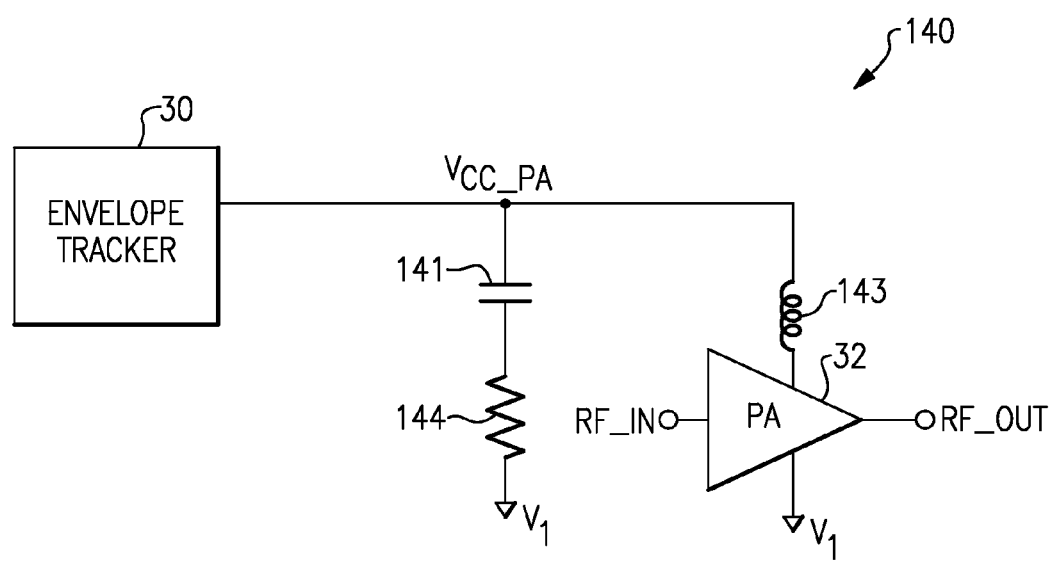
FIG. 10 is a schematic diagram of an example of a power amplifier system.

FIG. 10 is a schematic diagram of an example of a power amplifier system 140. The power amplifier system 140 includes the envelope tracker 30, the power amplifier 32, a capacitor 141, an inductor 143, and a resistor 144. The power amplifier 32 is configured to amplify a RF input signal RF_IN to generate an amplified RF signal RF_OUT. The illustrated envelope tracker 30 is configured to generate a power amplifier supply voltage $V_{CC\_PA}$ for the power amplifier 32.

The inductor 143 includes a first end configured to receive the power amplifier supply voltage $V_{CC\_PA}$ and a second end electrically connected to a supply input of the power amplifier 32. The inductor 143 can be used to provide the power amplifier 32 with the power amplifier supply voltage $V_{CC\_PA}$ while choking or blocking RF signals and noise. The capacitor 141 includes a first end electrically connected to the power amplifier supply voltage $V_{CC\_PA}$ and a second end electrically connected to a first end of the resistor 144. The second resistor 144 further includes a second end electrically connected to the first voltage supply $V_1$.

The power amplifier system 140 of FIG. 10 is similar to the power amplifier system 60 of FIG. 6. However, in contrast to the power amplifier system 60 of FIG. 6 that includes a bypass capacitor 63 connected between the power amplifier supply voltage $V_{CC\_PA}$ and the first voltage supply $V_1$, the power amplifier system 140 of FIG. 10 illustrates a configuration in which the capacitor 141 and the resistor 144 have been electrically connected in series between the power amplifier supply voltage $V_{CC\_PA}$ and the first voltage supply $V_1$.

Including the resistor 144 in series with the second end of the capacitor 141 and the first voltage supply $V_1$ can improve the stability of the power amplifier system 140. For example, when instability or oscillations are present in the power amplifier system 140, the resistor 144 can operate to dampen the oscillations so as to restore the power amplifier system 140 to stable operating conditions. Although the resistor 144 can also reduce the effectiveness of the capacitor 141 as a bypass or decoupling capacitor, in certain implementations it can be important to include the resistor 144 to achieve a stable power amplifier system.

Figure 11:
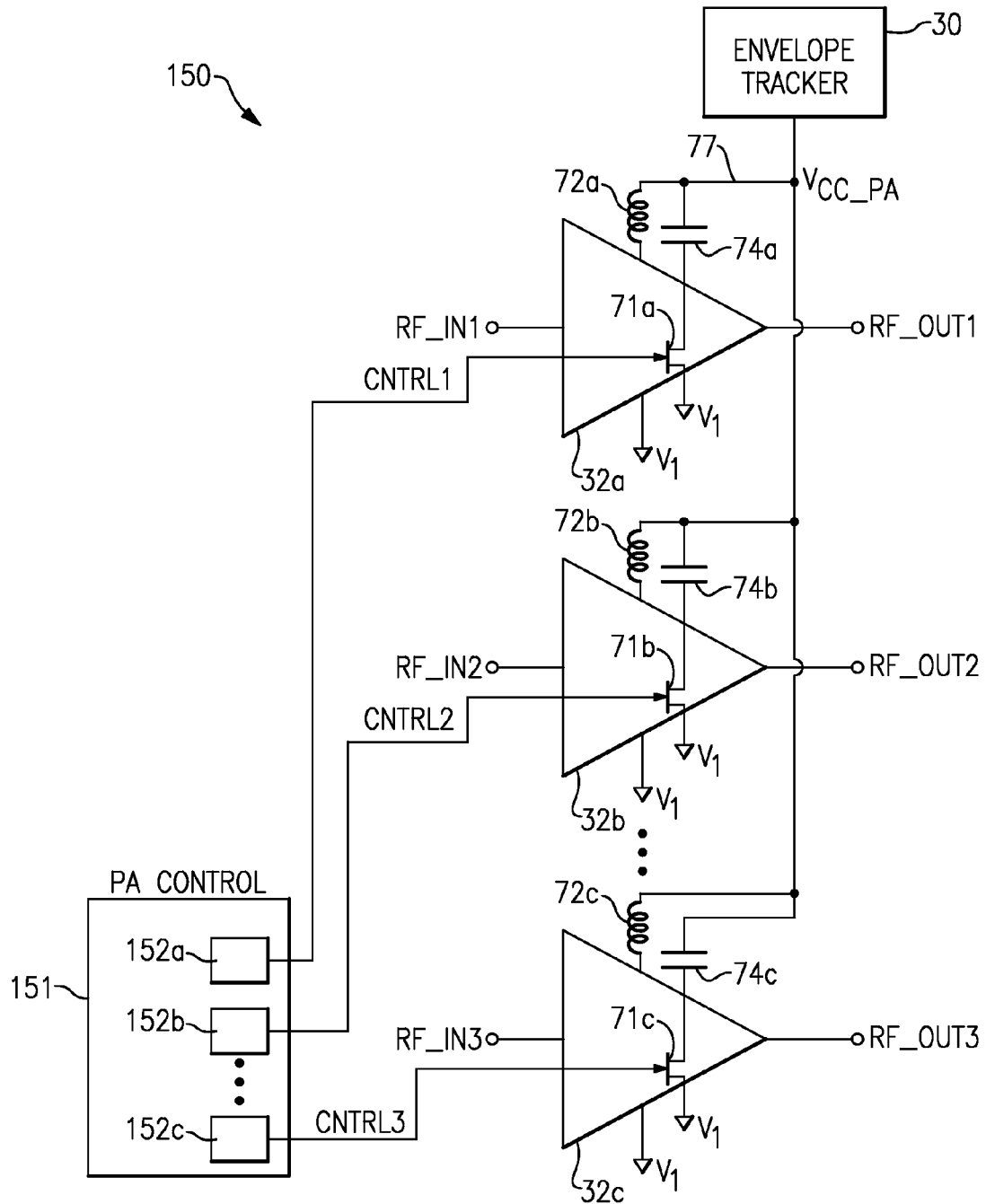
FIG. 11 is a schematic diagram of a power amplifier system in accordance with yet another embodiment.

FIG. 11 is a schematic diagram of a power amplifier system 150 in accordance with yet another embodiment. The illustrated power amplifier system 150 includes the envelope tracker 30, first to third field-effect transistors (FETs) 71a-71c, first to third inductors 72a-72c, first to third switched capacitors 74a-74c, and a power amplifier control block 151. Although FIG. 11 illustrates a configuration using three power amplifiers, the power amplifier system 150 can be modified to include more or fewer power amplifiers.

The first power amplifier 32a includes an input for receiving a first RF input signal RF_IN1 and an output for generating the first amplified RF output signal RF_OUT1. Additionally, the second power amplifier 32b includes an input for receiving a second RF input signal RF_IN2 and an output for generating the second amplified RF output signal RF_OUT2, and the third power amplifier 32c includes an input for receiving a third RF input signal RF_IN3 and an output for generating the third amplified RF output signal RF_OUT3.

The envelope tracker 30 is configured to generate a power amplifier supply voltage $V_{CC\_PA}$ for the first to third power amplifiers 32a-32c. The power amplifier supply voltage $V_{CC\_PA}$ is distributed to the first to third power amplifiers 32a-32c using the $V_{CC\_PA}$ supply node or network 77. The first to third inductors 72a-72c have been used to provide the power amplifier supply voltage $V_{CC\_PA}$ to the first to third power amplifiers 32a-32c, respectively, while choking or blocking RF signals generated by the first to third power amplifiers 32a-32c.

The power amplifier system 70 includes the first to third switched capacitors 74a-74c and the first to third FETs 71a-71c, which can be used to control a capacitive loading of the envelope tracker 30. For example, the first to third switched capacitors 74a-74c are electrically connected between the $V_{CC\_PA}$ supply node 77 and the drains of the first to third FETs 71a-71c, respectively. Additionally, the sources of the first to third FETs 71a-71c are each electrically connected to the first supply voltage $V_1$, and the gates of the first to third FETs 71a-71c are configured to receive first to third control signals CNTRL1 to CNTRL3.

The power amplifier control block 151 can be used to control a voltage level of the first to third control signals CNTRL1 to CNTRL3 so as to help control the loading of the envelope tracker 30. For example, the power amplifier control block 151 can control the channel impedance of the first to third FETs 71a-71c using the first to third control signals CNTRL1 to CNTRL3, respectively. By configuring one or more of the first to third FETs 71a-71c in a high impedance state, the power amplifier control block 151 can electrically float the ends of associated switching capacitors so as to control the capacitive loading of the envelope tracker 30. For example, the power amplifier control block 151 can bias the first FET 71a in a cutoff mode of operation using the first control signal CNTRL1 to electrically float an end of the first switched capacitor 74a. Likewise, the power amplifier control block 151 can bias the second and third FETs 71b, 71c in cutoff using the second and third control signals CNTRL2, CNTRL3 to electrically float an end of the second and third switched capacitors 74b, 74c, respectively.

The power amplifier control block 151 can also be used to control the stability of one or more of the first to third power amplifiers 32a-32c. For example, when one or more of the first to third power amplifiers 32a-32c is enabled, the power amplifier control block 151 can bias an associated FET to have a resistance suitable for improving power amplifier stability. For instance, when the first power amplifier 32a is enabled, the power amplifier control block 151 can bias the first FET 71a in a linear mode of operation using the first control signal CNTRL1 so as to have a channel resistance suitable for dampening any oscillations associated with the first power amplifier 32a. Additionally, when the second power amplifier 32b is enabled, the power amplifier control block 151 can bias the second FET 71b in a linear mode using the second control signal CNTRL2 so as to have a channel resistance suitable for dampening any oscillations associated with the second power amplifier 32b. Furthermore, when the third power amplifier 32c is enabled, the power amplifier control block 151 can bias the third FET 71c in a linear mode using the third control signal CNTRL3 so as to have a channel resistance suitable for dampening any oscillations associated with the third power amplifier 32c.

Accordingly, in certain implementations the power amplifier control block 151 can be used to electrically float an end of one or more switched capacitors associated with disabled power amplifiers, while providing a series resistance between the first power supply $V_1$ and one or more switched capacitors associated with enabled power amplifiers. Thus, the power amplifier control block 151 can use the first to third FETs 71a-71c to selectively include or exclude each of the first to third switched capacitors 74a-74c as capacitive loads on the envelope tracker 30, while providing a resistance suitable for dampening to each switched capacitor that is included as a capacitive load.

In one embodiment, when biasing a FET as a dampening resistor, the power amplifier control block 151 can be configured to bias the FET to have a channel resistance in the range of about 0.5Ω to about 2Ω. However, other channel resistances will be readily determined by one of skill in the art.

The first to third control signals CNTRL1 to CNTRL3 can be generated in any suitable manner. For example, in the configuration illustrated in FIG. 11, the first control signal CNTRL1 has been generated using a first D-to-A converter 152a, the second control signal CNTRL2 has been generated using a second D-to-A converter 152b, and the third control signal CNTRL3 has been generated using a third D-to-A converter 152c. However, other configurations can be used to generate the first to third control signals CNTRL1 to CNTRL3.

In some implementations, all or part of the power amplifier system 150 can be implemented on a multi-chip module (MCM). For example, in one embodiment, the first power amplifier 32a is implemented on a first amplification die of the MCM and the power amplifier control block 151 is implemented on a bias control die of the MCM.

Although FIG. 11 illustrates a configuration using the first to third FETs 71a-71c as switches for the first to third switched capacitors 74a-74c, respectively, other configurations are possible. For example, in some implementations other devices, including, for example, pin diodes, can be used as switches. In one embodiment, when biasing a switch as a dampening resistor, the power amplifier control block 151 can be configured to bias the switch to have a resistance in the range of about 0.5Ω to about 2Ω. However, other resistances will be readily determined by one of skill in the art.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A power amplifier system comprising:
a first power amplifier configured to receive a power amplifier supply voltage, the first power amplifier having an enabled state and a disabled state;
a supply control circuit configured to control a voltage level of the power amplifier supply voltage;
a first switchable capacitor;
a first field effect transistor (FET) electrically connected in series with the first switchable capacitor between the power amplifier supply voltage and a first voltage; and
a power amplifier control circuit configured to control a voltage level of a gate of the first FET, the power amplifier control circuit configured to bias the first FET in a linear mode of operation when the first power amplifier is enabled to provide stability to the first power amplifier, the power amplifier control circuit further configured to turn off the first FET when the first power amplifier is disabled to reduce a capacitive loading of the supply control circuit.

2. The power amplifier system of claim 1 wherein the power amplifier control circuit is further configured to bias the first FET as a dampening resistor when the first power amplifier is enabled.

3. The power amplifier system of claim 2 wherein the power amplifier control circuit is configured to bias a gate of the first FET so as to have a channel resistance in the range of about 0.5Ω to about 2Ω when the first power amplifier is enabled.

4. The power amplifier system of claim 2 wherein the power amplifier control circuit includes a digital-to-analog converter configured to generate a bias signal configured to control the voltage level of the gate of the first FET.

5. The power amplifier system of claim 1 further comprising a second power amplifier configured to receive the power amplifier supply voltage, the second power amplifier having an enabled state and a disabled state.

6. The power amplifier system of claim 5 further comprising a second switchable capacitor and a second FET electrically connected in series between the power amplifier supply voltage and the first voltage, the power amplifier control circuit further configured to bias the second FET in a linear mode of operation when the second power amplifier is enabled, the power amplifier control circuit further configured to turn off the second FET when the second power amplifier is disabled.

7. The power amplifier system of claim 1 wherein the supply control circuit comprises an envelope tracking circuit.

8. The power amplifier system of claim 7 wherein the first power amplifier is configured to amplify a first radio frequency signal when the first power amplifier is enabled, the envelope tracking circuit configured to control the voltage level of the power amplifier supply voltage based at least partly on an envelope of the first radio frequency signal.

9. The power amplifier system of claim 1 wherein the first voltage comprises a ground node.

10. A mobile device comprising:
a first power amplifier configured to receive a power amplifier supply voltage and an input signal, the first power amplifier having an enabled state and a disabled state;
a transceiver configured to generate the input signal;
a supply control circuit configured to control a voltage level of the power amplifier supply voltage;
a first switchable capacitor;
a first field effect transistor (FET) electrically connected in series with the first switchable capacitor between the power amplifier supply voltage and a first voltage; and
a power amplifier control circuit configured to control a voltage level of a gate of the first FET, the power amplifier control circuit configured to bias the first FET in a linear mode of operation when the first power amplifier is enabled to provide stability to the first power amplifier, the power amplifier control circuit further configured to turn off the first FET when the first power amplifier is disabled to reduce a capacitive loading of the supply control circuit.

11. The mobile device of claim 10 wherein the power amplifier control circuit is further configured to bias the first FET as a dampening resistor when the first power amplifier is enabled.

12. The mobile device of claim 10 wherein the supply control circuit comprises an envelope tracking circuit configured to receive an envelope signal from the transceiver, the envelope tracking circuit configured to control the voltage level of the power amplifier supply voltage based on the envelope signal.

13. The mobile device of claim 12 further comprising a battery configured to provide a battery voltage to the envelope tracking circuit.

14. The mobile device of claim 10 further comprising a switch and an antenna, the first power amplifier including an output electrically connected to the antenna through the switch.

15. A multi-chip module comprising:
a first switchable capacitor;
a power amplifier die including a first power amplifier configured to receive a power amplifier supply voltage, the first power amplifier having an enabled state and a disabled state, the power amplifier die further including a first field effect transistor (FET) electrically connected in series with the first switchable capacitor between the power amplifier supply voltage and a first voltage; and
a bias control die including a power amplifier control circuit configured to control a voltage level of a gate of the first FET, the power amplifier control circuit configured to bias the first FET in a linear mode of operation when the first power amplifier is enabled to provide stability to the first power amplifier, the power amplifier control circuit further configured to turn off the first FET when the first power amplifier is disabled.

16. The multi-chip module of claim 15 wherein the power amplifier control circuit is further configured to bias the first FET as a dampening resistor when the first power amplifier is enabled.

17. The multi-chip module of claim 16 wherein the power amplifier control circuit is configured to bias a gate of the first FET so as to have a channel resistance in the range of about 0.5Ω to about 2Ω when the first power amplifier is enabled.

18. The multi-chip module of claim 15 further comprising a second power amplifier die including a second power amplifier configured to receive the power amplifier supply voltage, the second power amplifier having an enabled state and a disabled state.

19. The multi-chip module of claim 18 further comprising a second switchable capacitor, the second FET electrically connected in series with the second switchable capacitor between the power amplifier supply voltage and the first voltage, the power amplifier control circuit further configured to bias the second FET in a linear mode of operation when the second power amplifier is enabled, the power amplifier control circuit further configured to turn off the second FET when the second power amplifier is disabled.

20. The multi-chip module of claim 15 wherein the first switchable capacitor is a surface mount component.

* * * * *